United States Patent
Koo et al.

(10) Patent No.: US 7,348,593 B2
(45) Date of Patent: Mar. 25, 2008

(54) THIN FILM TRANSISTOR AND METHOD OF FABRICATING THE SAME

(75) Inventors: Jae-Bon Koo, Suwon-si (KR); Min-Chul Suh, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 150 days.

(21) Appl. No.: 11/193,474

(22) Filed: Aug. 1, 2005

(65) Prior Publication Data
US 2006/0027805 A1 Feb. 9, 2006

(30) Foreign Application Priority Data
Aug. 7, 2004 (KR) .................. 10-2004-0062234

(51) Int. Cl.
*H01L 51/00* (2006.01)
(52) U.S. Cl. .................. 257/40; 257/759; 257/59; 257/66; 257/E29.151; 257/E51.005; 438/82; 438/99
(58) Field of Classification Search .................. None
See application file for complete search history.

(56) References Cited

U.S. PATENT DOCUMENTS

2002/0117691 A1* 8/2002 Choi et al. .................. 257/225
2003/0047729 A1* 3/2003 Hirai et al. .................. 257/40
2005/0156161 A1* 7/2005 Hanna et al. .................. 257/40
2006/0269849 A1 11/2006 Lee
2007/0069210 A1* 3/2007 Yamazaki et al. .................. 257/59

FOREIGN PATENT DOCUMENTS

| KR | 10-2003-0016981 | 3/2003 |
| KR | 10-2004-0067047 | 7/2004 |
| WO | WO2005/047967 | 5/2005 |

\* cited by examiner

*Primary Examiner*—Sue A. Purvis
*Assistant Examiner*—Scott R. Wilson
(74) *Attorney, Agent, or Firm*—Robert E. Bushnell, Esq.

(57) ABSTRACT

An organic thin film transistor (OTFT) having an adhesive layer and a method of fabricating the same. The OTFT includes a gate electrode formed on a substrate, a gate insulating layer formed on the gate electrode and on remaining exposed portions of the substrate, an adhesive layer formed on the gate insulating layer, source/drain electrodes formed on the adhesive layer, and a semiconductor layer formed on the source/drain electrodes and on the adhesive layer. The gate insulating layer and the semiconductor layer are organic, the adhesive layer providing adhesion between the source/drain electrodes and the gate insulating film while preventing gate leakage current while also improving contact resistance.

21 Claims, 5 Drawing Sheets

THIN FILM TRANSISTOR AND METHOD OF FABRICATING THE SAME

CLAIM OF PRIORITY

This application makes reference to, incorporates herein, and claims all benefits accruing under 35 U.S.C. §119 from an application for THIN FILM TRANSISTOR AND METHOD OF FABRICATING THE SAME earlier filed in the Korean Intellectual Property Office on Aug. 7, 2004 and there duly assigned Serial No. 2004-0062234.

BACKGROUND OF THE INVENTION

1. Field of the Invention

The present invention relates to a thin film transistor (TFT) and a method of fabricating the same, and more particularly, to an organic thin film transistor (OTFT) having improved adhesion between source/drain electrodes and a gate insulating layer with no gate leakage current caused by pinhole failure in the gate insulating layer.

2. Description of the Related Art

OTFTs are driving elements expected to be used in next generation display devices. Active research is currently being conducted on OTFTs. OTFTs use a semiconductor layer made of an organic material and have nearly the same structure as silicon TFTs which use a silicon, non-organic semiconductor layer.

OTFTs are generally classified according to the type of the organic material used in the semiconductor layer. The organic material can be a low molecular organic material, such as oligothiophene, pentacene, etc. or a high molecular organic material such as polythiophene-based polymer.

OTFTs may have a top-contact structure or a bottom-contact structure based on whether the organic semiconductor layer is beneath or above the source/drain electrodes. In the top-contact structure, source/drain electrodes are formed on the semiconductor layer. In the bottom-contact structure, source/drain electrodes are formed below the semiconductor layer. OTFTs having the bottom-contact structure are more prevalent since they are less apt to be damaged during subsequent manufacturing processes and can be more easily processed than OTFTs having the top-contact structure.

Even though bottom contact OTFTs are preferred over top-contact OTFTs, bottom-contact OTFTs still have many deficiencies. For example, the adhesion between the source/drain electrodes and the underlying gate insulating layer is weak, the contact resistance between the source/drain electrodes and the gate insulating layer is poor and a gate leakage current occurs through the organic gate insulating layer because of pinhole failure. Therefore, what is needed is an improved design for a bottom-contact OTFT that overcomes the above problems.

SUMMARY OF THE INVENTION

It is therefore an object of the present invention to provide an improved design for a bottom-contact OTFT.

It is also an object of the present invention to provide for a method of making the improved and novel bottom-contact OTFT.

It is yet an object of the present invention to provide a design for a bottom-contact OTFT that has the good adhesion between the source/drain electrodes and the gate insulating layer.

It is still an object of the present invention to provide a method for making the bottom-contact OTFT that results in good adhesion between the source/drain electrodes and the gate insulating layer.

It is further an object of the present invention to provide a design for a bottom-contact OTFT that has the improved contact resistance between the source/drain electrodes and the gate insulating layer.

It is also an object of the present invention to provide a method for making the novel bottom-contact OTFT having the improved contact resistance between the source/drain electrodes and the gate insulating layer.

It is yet an object of the present invention to provide a design for a bottom-contact OTFT that prevents leakage current through the gate insulating layer.

It is still an object of the present invention to provide a method for making the novel bottom-contact OTFT that does not have the leakage current through the gate insulating layer.

These and other objects may be achieved by a TFT that includes a gate electrode formed on a substrate, a gate insulating layer formed on the gate electrode and on remaining exposed portions of the substrate, an adhesive layer formed on the gate insulating layer, source drain electrodes formed on the adhesive layer so that between the source electrode and the drain electrode over the gate electrode remains an exposed portion of the adhesive layer, and a semiconductor layer formed on the source/drain electrodes and on remaining exposed portions of the adhesive layer. The gate insulating layer can be an organic insulating layer made of either benzocyclobutene (BCB), polyimide or parylene.

A portion of the adhesive layer contacting the source/drain electrodes serves to increase the adhesive strength between the source/drain electrodes and the gate insulating layer. The portion of the adhesive layer located between the source electrode and the drain electrode (i.e. over the gate electrode) serves to prevent gate leakage current through the gate insulating layer. The adhesive layer can be an oxide of an easily oxidized metal that has a lower work function than the metal used for the source/drain electrodes. The metal of the metal oxide used in the adhesive layer can be Ti, Cr, Mo or Al.

Each of the source/drain electrodes can include an electrode layer and a binding layer sandwiched between the electrode layer and the adhesive layer. The electrode layer can be made of one or more of Au, Ni, Pt, Pd, Os, Rh, Ru and Ir which are noble metals. The binding layer can include one of Ti, Cr, Mo or Al.

According to another aspect of the present invention, there is provided a flat panel display that includes at least one thin film transistor (TFT) formed on a substrate, the TFT includes a gate electrode, source and drain electrodes, a semiconductor layer and an insulating layer located between the gate electrode and the source and drain electrodes. Each of the source and drain electrodes include an electrode layer made of a noble metal, the semiconductor layer being an organic semiconductor layer, the insulating layer being a metal oxide layer that serves as both a gate insulating layer and as an adhesive layer that provides for better adhesion between the source/drain electrodes and the substrate.

According to still another aspect of the present invention, there is provided a method of fabricating a TFT, including forming a gate electrode on a substrate, forming a gate insulating layer on the gate electrode and on remaining exposed portions of the substrate, forming an adhesive layer on the gate insulating layer, forming the source/drain electrodes on the adhesive layer, forming a semiconductor layer on the source/drain electrodes and on remaining exposed portions of the adhesive layer located between the source electrode and the drain electrode.

The forming of the adhesive layer and the source/drain electrodes can include forming an insulating layer on the gate insulating layer, depositing a metal layer for the source/drain electrodes on the insulating layer, etching the insulating layer and the metal layer to form the adhesive layer and the source/drain electrodes, the adhesive layer being formed underneath the source/drain electrodes and on the gate insulating layer between the source electrode and the drain electrode.

The forming of the insulating layer can include depositing a metal layer and oxidizing the metal layer to a metal oxide layer to form the insulating layer. The metal layer can be oxidized by using either thermal oxidation or plasma oxidation. Or the metal oxide may be deposited directly onto the gate insulating layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
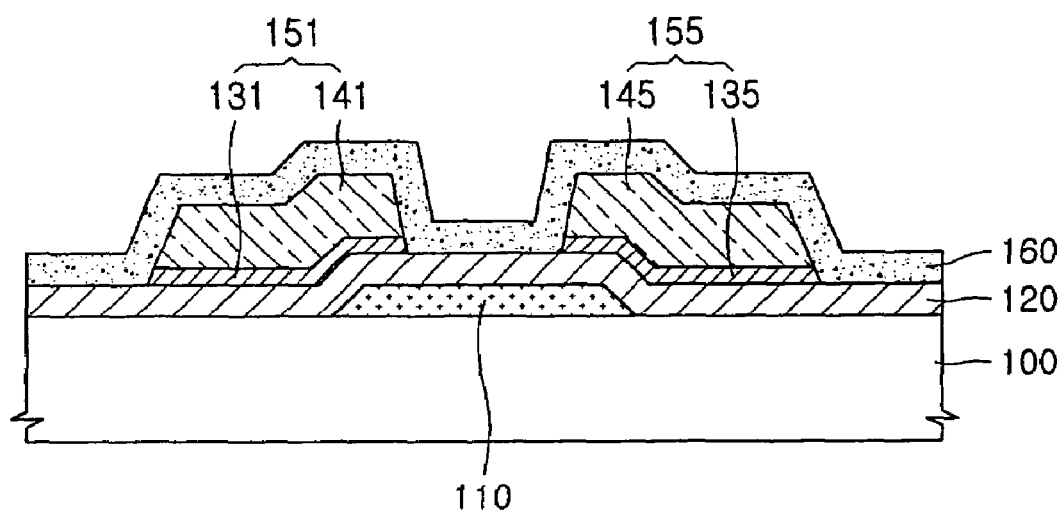
FIG. 1 is a cross-sectional view of an organic thin film transistor (OTFT)

Turning now to the figures, FIG. 1 is a cross-sectional view of an OTFT. Referring to FIG. 1, a gate electrode 110 is formed on a portion of the substrate 100 and a gate insulating layer 120 is formed on the gate electrode 110 and on remaining exposed portions of substrate 100. Source/drain electrodes 151 and 155 are formed on portions of the gate insulating layer 120 so that a portion of the gate insulating layer 120 corresponding to the gate electrode 110 between the source electrode 151 and the drain electrode 155 remains exposed.

A semiconductor layer 160 is formed on exposed portions of the gate insulating layer 120 and on the source/drain electrodes 151 and 155. The source/drain electrodes 151 and 155 respectively have a double-layered structure that includes electrode layers 141 and 145 that controls the work function and binding layers 131 and 135 that serve to improve adhesion between the electrode layers 141 and 145 and the gate insulating layer 120.

In the OTFT of FIG. 1 having the bottom-contact structure, because the source/drain electrodes 151 and 155 are double-layered structures, the adhesive strength between the source/drain electrodes 151 and 155 and the gate insulating layer 120 is poor. Also, in the OTFT of FIG. 1, hole injection occurs in the binding layers 131 and 135 that have low work functions, and thus the contact resistance between the source/drain electrodes 151 and 155 and the gate insulating layer 120 is poor. Further, pinhole failure is generated in the organic gate insulating layer so that a gate leakage current occurs because of a pinhole failure.

Figure 2:
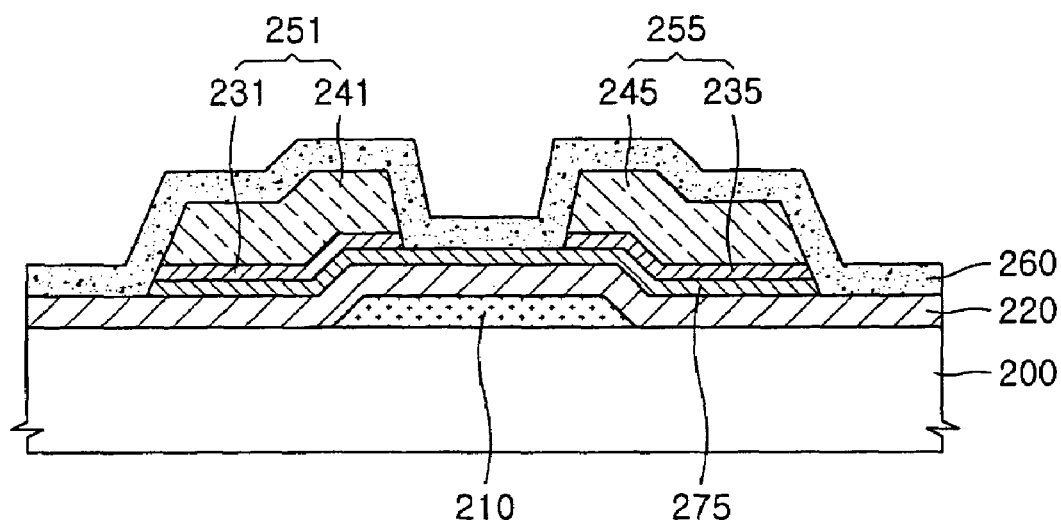
FIG. 2 is a cross-sectional view of an OTFT according to a first embodiment of the present invention.

Turning now to FIG. 2, FIG. 2 is a cross-sectional view of an organic thin film transistor (OTFT) according to a first embodiment of the present invention. Referring to FIG. 2, a gate electrode 210 is formed on portions of the substrate 200 and a gate insulating layer 220 is formed on the gate electrode 210 and on remaining exposed portions of the substrate 200. An adhesive layer 275 is formed on the gate insulating layer 220 and source/drain electrodes 251 and 255 are formed on portions of the adhesive layer 275 leaving other portions of the adhesive layer 275 that corresponds to the gate electrode 210 exposed. A semiconductor layer 260 having a predetermined conduction type, for example p-type, is formed on the source/drain electrodes 251 and 255 and on the exposed portions of the adhesive layer 275.

The substrate 200 can be made of glass or silicon. The substrate 200 can instead be made of plastics, such as polyethylene terephthalate (PET), polyethylene naphthalate (PEN), polyether sulfone (PES), polyether imide, polyphenylene sulfide (PPS), polyallyate, polyimide, polycarbonate (PC), cellulose triacetate, and cellulose acetate propionate (CAP), etc. The gate electrode 210 can be made of a conductive metal such as MoW, Al, Cr, Al/Cr, etc. The gate electrode 210 can instead be made of conductive polyaniline, a conductive poly pirrole, a conductive poly thiophene, polyethylene dioxythiophene (PEDOT) or polystyrene sulfonic acid (PSS), etc. The gate insulating layer 220 can be made of an organic insulating layer, for example benzocyclobutene (BCB), polyimide or parylene, etc.

The source/drain electrodes 251 and 255 respectively include electrode layers 241 and 245, and binding layers 231 and 235 that serve to increase adhesion between the electrode layers 241 and 245 and the gate insulating layer 220. The electrode layers 241 and 245 can be made of gold (Au), palladium (Pd), platinum (Pt), nickel (Ni), rhodium (Rh), ruthenium (Ru), iridium (Ir), and/or osmium (Os). The binding layers 231 and 235 are made of an easily oxidizable metal having a lower work function than the noble metal used in the electrode layers 241 and 245. The metal used in the binding layers 231 and 235 can be titanium (Ti), chromium (Cr), aluminum (Al), or molybdenum (Mo).

The semiconductor layer 260 can be made of an organic material such as pentacene, tetracene, anthracene, naphthalene, α-6-thiophene, perylene or its derivative, rubrene or its derivative, coronene or its derivative, perylene tetracarboxylic diimide or its derivative, perylene tetracarboxylic dianhydride or its derivative, polythiophene or its derivative, polyparaperylenevinylene or its derivative, polyfluorene or its derivative or polythiophenevinylene or its derivative.

The adhesive layer 275 serves to increase adhesion between the source/drain electrodes 251 and 255 and the gate insulating layer 220. The adhesive layer 275 also serves to prevent a gate leakage current from forming in the gate insulating layer 220 due to a pinhole failure. The portion of the adhesive layer 275 that contacts the source/drain electrodes 251 and 255 serves to increase adhesion between the source/drain electrodes 251 and 255 and the gate insulating layer 220. The exposed portion of the adhesive layer 275 between the source electrode 251 and the drain electrode 255 (i.e., a portion of the adhesive layer above the gate electrode 210) serves to prevent a gate leakage current from occurring because of a pinhole failure in the gate insulating layer 220.

The adhesive layer 275 is made of an oxide of an easily oxidizable metal that has a lower work function than the noble metal used in the electrode layers 241 and 245. In other words, the adhesive layer 275 is made of an oxide of the metal used in the binding layers 231 and 235, which can be Ti, Cr, Al or Mo.

Figure 3A:
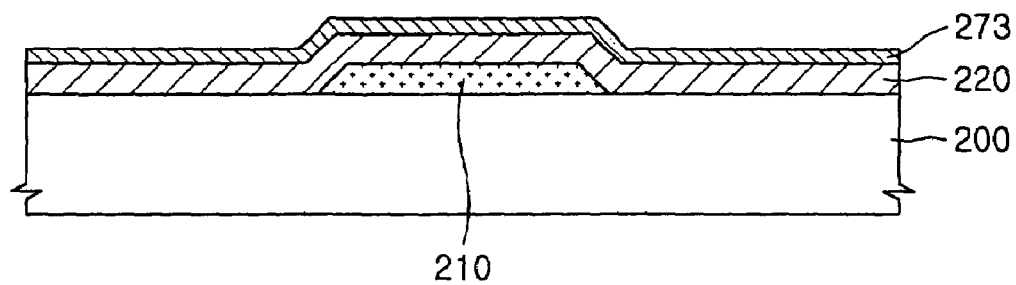
FIGS. 3A through 3C are cross-sectional views illustrating a first method of fabricating the OTFT of FIG. 2.
Figure 3B:
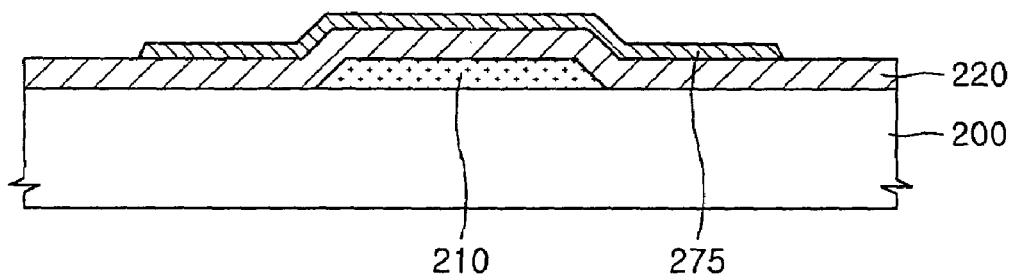
Figure 3C:
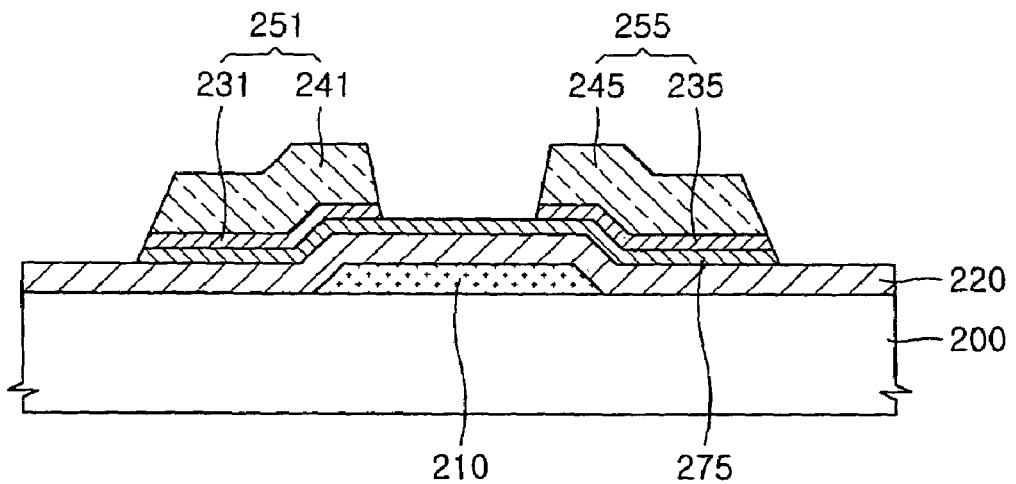

Turning now to FIGS. 3A through 3C, FIGS. 3A through 3C are cross-sectional views illustrating a first method of fabricating the OTFT illustrated in FIG. 2. Referring to FIG. 3A, a conductive metal or a conductive polymer, etc., is deposited on the substrate 200, the substrate being made of glass, silicon, or plastics, etc. The deposited conductive metal or conductive polymer is patterned to form the gate electrode 210. An organic insulating layer made of BCB, polyimide, PVP, or parylene, etc. is deposited on the gate electrode 210 and on remaining exposed portions of the substrate 200 to form the gate insulating layer 220.

An insulating layer 273, which is a metal oxide layer, is deposited on the gate insulating layer 220 by reactive sputtering. The insulating layer 273 is made of an oxide of an easily oxidizable metal that has a lower work function than the noble metal used to form the source/drain electrodes 251 and 255. For example, the metal used in the metal oxide for insulating layer 273 can be Ti, Cr, Al or Mo.

Referring now to FIG. 3B, the insulating layer 273 is patterned. When patterned, insulating layer 273 is formed beneath where the source/drain electrodes 251 and 255 are later to be made, and serves to bond and adhere the source/drain electrodes 251 and 255 to the gate insulating layer 220. The insulating layer 273 also prevents gate leakage current from developing through the gate insulating layer 220. The patterned insulating layer 273 becomes the adhesive layer 275.

Turning now to FIG. 3C, the source/drain electrodes 251 and 255 are formed on the adhesive layer 275. To make the source/drain electrodes 251 and 255 in the first embodiment of the present invention, two separate layers of metal are deposited and patterned. A first metal layer or a lowermost metal layer of the source/drain electrodes 251 and 255 serves to adhere the source/drain electrodes 251 and 255 to the gate insulating layer 220. After the first metal layer is deposited, a second metal layer made of a noble metal for adjusting a work function is deposited on the first metal layer. Then, the first and second metal layers are patterned to form the source/drain electrodes 251 and 255, the source electrode 251 having a binding layer 231 and an electrode layer 241. Similarly, the drain electrode 255 is made of a binding layer 235 and an electrode layer 245.

The electrode layers 241 and 245 used in the source/drain electrodes 251 and 255 are made of a noble metal such as Au, Ni, Pt, Pd, Os, Rh, Ru or Ir. The binding layers 231 and 235 are made of an easily oxidizable metal that has a lower work function than the noble metal used for the electrode layers 241 and 245. Examples of metals used in the binding layers 231 and 235 are Ti, Cr, Mo and Al.

After formation of the source/drain electrodes 251 and 255, a layer of an organic semiconductor material is deposited on the source/drain electrodes 251 and 255 and on remaining exposed portions of the adhesive layer 275 to form the semiconductor layer 260 and the structure as illustrated in FIG. 2. The semiconductor layer 260 can be left unpatterned or may instead be patterned. Since the adhesive layer 275 is located between the source/drain electrodes 251 and 255 and the gate insulating layer 220, the adhesion between the source/drain electrodes 251 and 255 and the gate insulating layer 220 can be increased as a result. Also, between the source electrode 251 and the drain electrode 255, the adhesive layer 275 is sandwiched between the semiconductor layer 260 and the gate insulating layer 220, preventing the occurrence of a gate leakage current caused by pinhole failure of the organic gate insulating layer 220.

Turning now to FIGS. 4A through 4D, FIGS. 4A through 4D are cross-sectional views illustrating a second method of fabricating the OTFT illustrated in FIG. 2. The method of fabricating the OTFT illustrated in FIGS. 4A through 4D is the same as in FIGS. 3A through 3C with the exception that they have a different process in forming the adhesive layer 275.

Figure 4A:
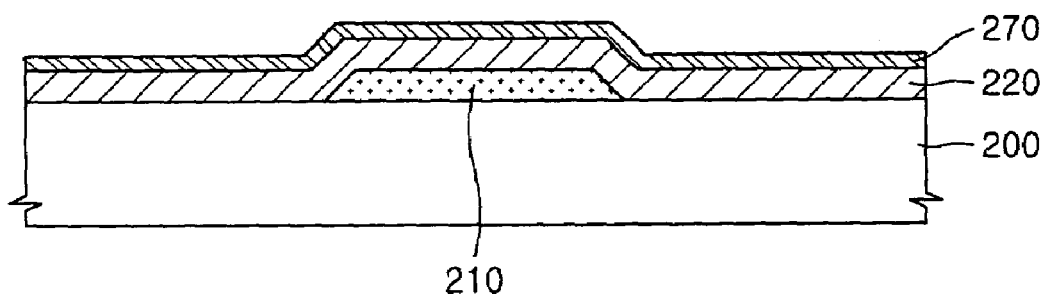
FIGS. 4A through 4D are cross-sectional view illustrating a second method of fabricating the OTFT of FIG. 2.

Referring to FIG. 4A, a material used to form the gate electrode 210, such as a conductive metal or a conductive polymer, etc., is deposited on the substrate 200 made of glass, silicon, or plastics, etc. The deposited material is then patterned to form the gate electrode 210. An organic insulating layer, such as BCB, polyimide, PVP, or parylene, etc. is deposited on the gate electrode 210 and on remaining exposed portions of the substrate 200 to form the gate insulating layer 220. A metal layer 270 is deposited on the gate insulating layer 220. The second method of FIGS. 4A through 4D differs from that of FIGS. 3A through 3C in that in the formation of the adhesive layer 275, a metal and not a metal oxide is deposited. The metal is then oxidized in the second method after being deposited on the organic gate insulating layer 220. The metal layer 270 is made of an easily oxidizable metal that has a lower work function than the noble metal used in the source/drain electrodes 251 and 255. The metal used for metal layer 270 may be Ti, Cr, Al or Mo.

Figure 4B:
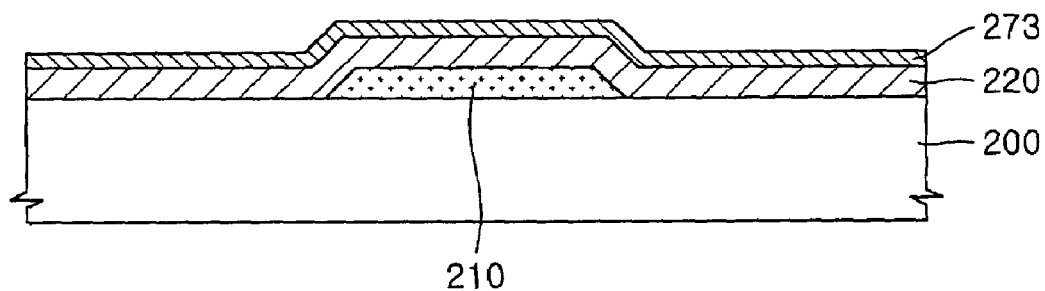
Figure 4C:
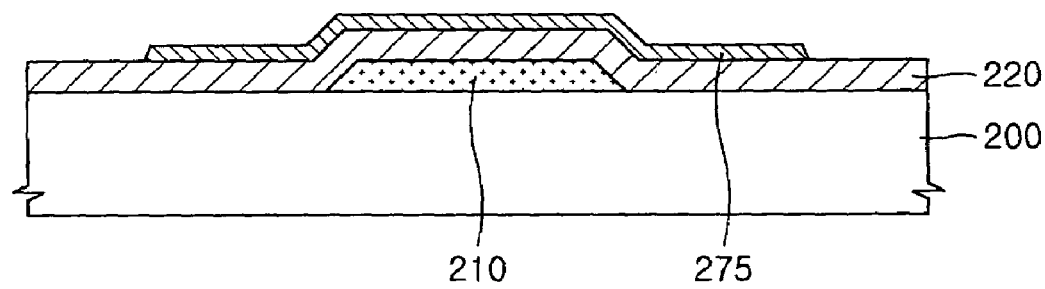

Referring to FIG. 4B, the metal layer 270 is oxidized after being deposited to form a metal oxide which is insulating layer 273. The oxidation of the metal layer 270 to the metal oxide layer 273 can be performed using thermal oxidation under $O_2$ atmosphere in a furnace or plasma oxidation using $O_2$ or $O_3$ plasma. Referring to FIG. 4C, the insulating layer 273 is patterned so that the insulating layer 273 remains where the source/drain electrodes 251 and 255 are to be later formed. After patterning, the insulating layer 273 becomes adhesive layer 275.

Figure 4D:
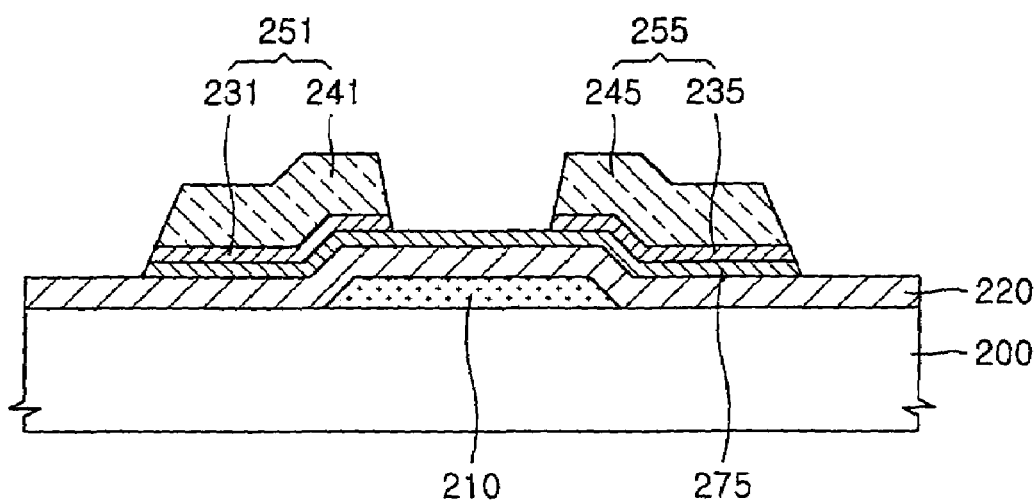

Referring now to FIG. 4D, two metal layers for the source/drain electrodes are deposited and patterned. The first metal layer serves to provide adhesion between the source/drain electrodes 251 and 255 and the gate insulating layer 220. This first metal layer is on the structure over the adhesive layer 275. Then, the second metal layer made of a noble metal for adjusting a work function is deposited on the first metal layer. Then, the first and second metal layers are patterned to form the source/drain electrodes 251 and 255. The source electrode 251 is made out of a binding layer 231 and an electrode layer 241 while the drain electrode 255 is made out of a binding layer 235 and an electrode layer 245. After formation of the source/drain electrodes 251 and 253, the semiconductor layer 260 is formed over the entire structure including the source/drain electrodes 251 and 255 and the exposed portion of the adhesive layer 275 between the source/drain electrodes 251 and 255, thus obtaining the OTFT as illustrated in FIG. 2.

In the methods of fabricating the OTFT illustrated in FIGS. 3A through 3C and FIGS. 4A through 4D, the insulating layer 273 is patterned to form the adhesive layer 275 by etching using photolithography and using a mask. Next, the first and second metal layers are sequentially deposited on the adhesive layer 275. Again using photolithography and a mask, the two metal layers are patterned to form the source/drain electrodes 251 and 255. That is, etching is performed in two separate times, once for the patterning of the adhesive layer 275 and a second time to pattern the source/drain electrodes 251 and 255. Alternatively, the insulating layer 273 and the first and second metal layers can be sequentially deposited on the gate insulating layer 220 and all three of these layers can be etched at the same time using a halftone mask to form the adhesive layer 275 and the source/drain electrodes 251 and 255, simultaneously.

Figure 5:
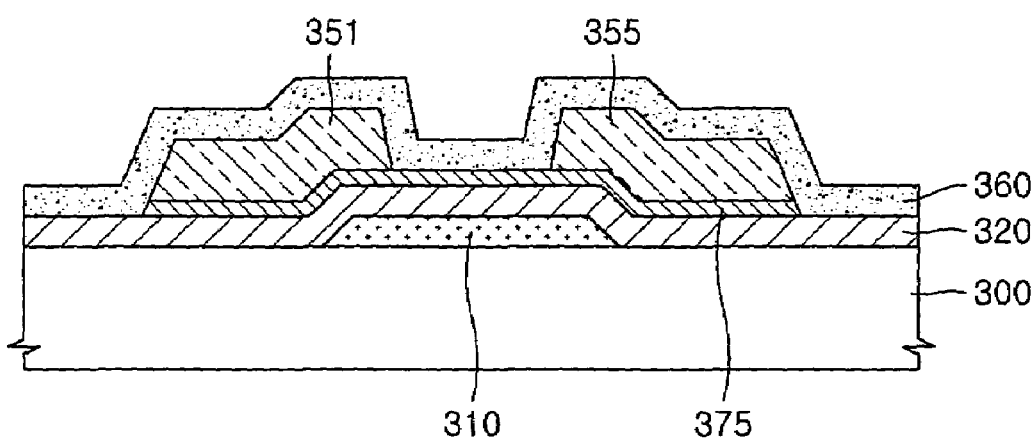
FIG. 5 is a cross-sectional view of an OTFT according to a second embodiment of the present invention.

Turning now to FIG. 5, FIG. 5 is a cross-sectional view of an organic thin film transistor (OTFT) according to a second embodiment of the present invention. The OTFT illustrated in FIG. 5 has the same cross-sectional structure as in FIG. 2 except that the source/drain electrodes are made of the electrode layers only and do not include the binding layers 231 and 235.

Referring now to FIG. 5, a gate electrode 310 is formed on a substrate 300 and a gate insulating layer 320 is formed on the gate electrode 310 and on exposed portions of the substrate 300. An adhesive layer 375 is formed on the gate insulating layer 320 and source/drain electrodes 351 and 355 are formed on the adhesive layer 375. Between the source electrode 351 and the drain electrode 355 remains an exposed portion of the adhesive layer 375 that corresponds to the gate electrode 310. A semiconductor layer 360 is formed on top of the resultant structure, including the source/drain electrodes 351 and 355 and the exposed portion of adhesive layer 375.

The substrate 300 can be made of glass or silicon. The substrate 300 can instead be made of plastics, such as polyethylene terephthalate (PET), polyethylene naphthalate (PEN), polyether sulfone (PES), polyether imide, polyphenylene sulfide (PPS), polyallyate, polyimide, polycarbonate (PC), cellulose triacetate, and cellulose acetate propionate (CAP), etc.

The gate electrode 310 is made of a conductive metal, such as MoW, Al, Cr, Al/Cr, etc. The gate electrode 310 can instead be made out of conductive polyaniline, conductive poly pirrole, conductive poly thiophene, polyethylene dioxythiophene (PEDOT) or polystyrene sulfonic acid (PSS), etc.

The gate insulating layer 320 can be made out of an organic insulating layer, such as BCB, polyimide, or parylene, etc. Each of the source/drain electrodes 351 and 355 is made only of a single electrode layer in the second embodiment of the present invention. The electrode layers used for the source/drain electrodes 351 and 355 can be a noble metal such as Au, Pd, Pt, Ni, Rh, Ru, Ir or Os.

The semiconductor layer 360 can be made of an organic material, such as pentacene, tetracene, anthracene, naphthalene, α-6-thiophene, perylene or its derivative, rubrene or its derivative, coronene or its derivative, perylene tetracarboxylic diimide or its derivative, perylene tetracarboxylic dianhydride or its derivative, polythiophene or its derivative, polyparaperylenevinylene or its derivative, polyfluorene or its derivative or polythiophenevinylene or its derivative.

A portion of the adhesive layer 375 directly underneath and contacting the source/drain electrodes 351 and 355 serves to provide adhesion between the source/drain electrodes 351 and 355 and the gate insulating layer 320. A portion of the adhesive layer 375 between the source electrode 351 and the drain electrode 355 is sandwiched in between the semiconductor layer 360 and the gate insulating layer 320 and serves to prevent the formation of a leakage current from the gate electrode 310 caused by pinhole failure in the gate insulating layer 320.

Figure 6A:
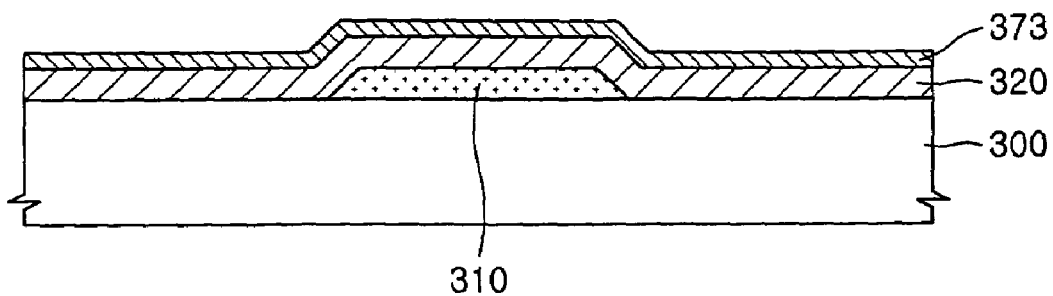
FIGS. 6A through 6C are cross-sectional views for illustrating one method that can be used to fabricate the OTFT of FIG. 5.
Figure 6B:
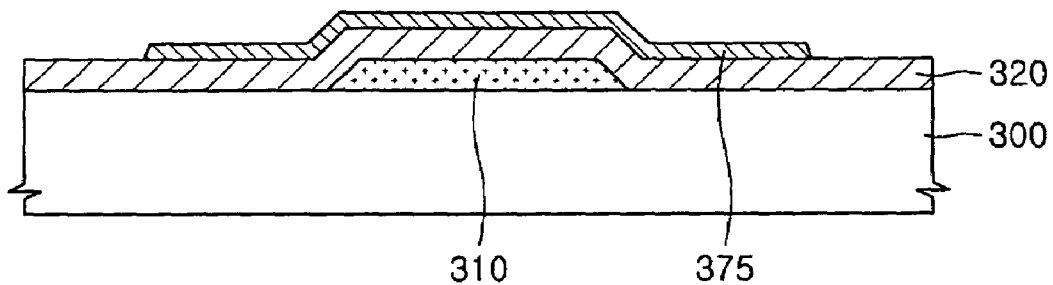
Figure 6C:
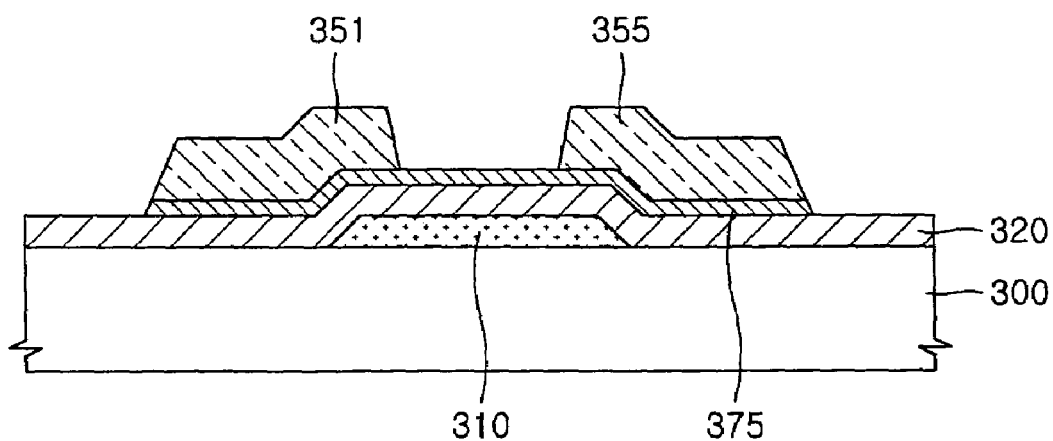

Turning now to FIGS. 6A through 6C, FIGS. 6A through 6C are cross-sectional views illustrating one possible method of fabricating the OTFT illustrated in FIG. 5. Referring to FIG. 6A, the material used to form the gate electrode 310, such as a conductive metal or a conductive polymer, etc. is deposited on the substrate 300 made of glass, silicon, or plastics, etc. The deposited material is then patterned to form the gate electrode 310. An organic insulating layer, such as BCB, polyimide, PVP, or parylene, etc. is deposited on the gate electrode 310 and on exposed portions of the substrate 300 to form the gate insulating layer 320.

An insulating layer 373 is deposited on the gate insulating layer 320 by reactive sputtering. The insulating layer 373 is made of an easily oxidizable metal that has a lower work function than the noble metal used in the source/drain electrodes 351 and 355. The metal deposited for the insulating layer can be Ti, Cr, Al or Mo.

Referring to FIG. 6B, the insulating layer 373 is patterned to form the adhesive layer 375. The patterned adhesive layer 375 is present directly underneath where the source and drain electrodes 351 and 355 are to be formed as well as between where the source electrode 351 and the drain electrode 355 are to be formed. Referring to FIG. 6C, an electrode layer for adjusting a work function is deposited on the structure and then patterned to form the source/drain electrodes 351 and 355. The electrode layer can be made of a noble metal such as Au, Ni, Pt, Pd, Os, Rh, Ru or Ir. Then, an organic semiconductor material is deposited 360 over the source/drain electrodes 351 and 355 and over the adhesive layer 375 resulting in the structure as illustrated in FIG. 5.

Since the adhesive layer 375 is sandwiched in between the source/drain electrodes 351 and 355 and the gate insulating layer 320, the adhesion between the source/drain electrodes 351 and 355 made of a noble metal and the gate insulating layer 320 made of an organic material can be increased. Further, since the adhesive layer 375 located between the source electrode 351 and the drain electrode 355 is sandwiched in between the semiconductor layer 360 and the gate insulating layer 320, the gate leakage current due to the pinhole failure in the organic gate insulating layer 320 can be prevented.

In the OTFT illustrated in FIG. 5, the source/drain electrodes 351 and 355 made of a noble metal are attached to the gate insulating layer 320 by adhesive layer 375. Because this attachment is without the presence of the binding layer as in FIG. 2, the hole injection from the binding layer having a low work function does not occur. Thus, with the design of FIG. 5 without the binding layers, deterioration of the contact resistance between the source/drain electrodes 351 and 355 and the gate insulating layer 320 is prevented.

In the method of fabricating the OTFT illustrated in FIGS. 6A through 6C, the adhesive layer 375 used to promote adhesion and prevent the leakage current is patterned, and then, the noble metal layer is deposited on the adhesive layer 375 and patterned separately to form the source/drain electrodes 351 and 355. That is, the photolithography and the etching steps used to pattern each of the source/drain electrodes 351 and 355 and the adhesive layer 375 is performed in two separate times, once to pattern the adhesive layer 375 and a second time to pattern the source/drain electrodes. Alternatively, the insulating layer 373 and the noble metal layer can be sequentially deposited on the gate insulating layer 320 and etched together in a single etch step using a halftone mask to form the patterned adhesive layer 375 and the patterned source/drain electrodes 351 and 355 simultaneously.

In the OTFT illustrated in FIGS. 6A through 6C, the adhesive layer 375 can instead be formed by depositing a non-oxide metal layer on the gate insulating layer 320, oxidizing the metal layer after the metal layer is deposited using thermal oxidation or plasma oxidation, and patterning the metal oxide layer to form the adhesive layer 375, as was done in FIGS. 4A through 4D.

In the embodiments of the present invention, the gate insulating layer is made of an organic insulating layer such as BCB, polyimide, and parylene, etc. However, in the present invention, the gate insulating layer can instead be made out of an inorganic insulating layer, such as silicon nitride ($Si_3N_4$), silicon oxide ($SiO_2$), and aluminum oxide ($Al_2O_3$), etc. Alternatively, the gate insulating layer can be made out of an inorganic insulating layer having a high dielectric constant such as $Ta_2O_5$, $Y_2O_3$, $TiO_2$, Barium Zirconate Titanate (BZT) or Lead Zirconate Titanate (PZT), etc. In addition, the gate insulating layer can be a single or multi-layered structure where one layer is an inorganic insulating layer and the other layer is an organic insulating layer. In the embodiments of the present invention, the adhesive layer, instead of being a metal oxide using Ti, Cr, Al, and Mo, can instead be a metal nitride such as TiN, TiAlN, etc.

In the OTFT illustrated in FIGS. 2 and 5, the insulating layer for increasing the attachment and preventing the leakage current is formed on the gate insulating layer 220. Alternatively, the adhesive layer may instead be formed directly on the gate electrode and can function as both a gate insulating layer and as an adhesive layer used to attach the source/drain electrodes to the substrate while preventing gate leakage current. Thus, it is within the scope of the present invention to combine the gate insulating layer and the adhesive layer into a single layer. In this case, the adhesive layer can be made of the same material as used in the binding layers for the source/drain electrodes 251 and 255 in FIG. 2. Thus, the combined adhesive layer and gate insulating layer can use an easily oxidizable metal that has a lower work function than the noble metal layer used in the electrode layers of the source/drain electrodes. Examples of such metals are Ti, Cr, Al, and Mo, etc.

Although in the embodiments of the present invention, the insulating layer used to make the adhesive layer is made out of an oxide of a metal that is used to make the binding layers of the source/drain electrodes, it is to be appreciated that the present invention is in now way so limited. Instead, the adhesive layer can be made of any material that results in 1) an increase in the adhesion between the source/drain electrodes and the gate insulating layer and 2) a prevention of leakage current at the gate electrode caused by the pinhole failure in the gate insulating layer and still be within the scope of the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor (TFT), comprising:
   a gate electrode arranged on a substrate;
   a gate insulating layer arranged on the gate electrode and on exposed portions of the substrate;
   an adhesive layer arranged on the gate insulating layer;
   source/drain electrodes arranged on the adhesive layer, an exposed portion of the adhesive layer remaining between the source electrode and the drain electrode; and
   a semiconductor layer arranged on the source/drain electrodes and on the exposed portion of the adhesive layer.

2. The TFT of claim 1, the semiconductor layer comprises an organic semiconductor material, the gate insulating layer comprises an organic insulating layer that includes a substance selected from the group consisting of benzocyclobutene (BCB), polyimide and parylene.

3. The TFT of claim 1, the adhesive layer comprises an oxide of a second metal, the second metal being selected from the group consisting of Ti, Cr, Mo and Al.

4. The TFT of claim 1, each of the source/drain electrodes comprises:
   an electrode layer; and
   a binding layer arranged between the electrode layer and the adhesive layer.

5. The TFT of claim 4, the electrode layer comprises a first metal selected from the group consisting of Au, Ni, Pt, Pd, Os, Rh, Ru and Ir.

6. The TFT of claim 5, the adhesive layer comprises an oxide of a second metal, the second metal having a lower work function than the first metal.

7. The TFT of claim 6, the second metal being selected from the group consisting of Ti, Cr, Mo and Al.

8. The TFT of claim 4, the binding layer comprises a third metal selected from the group consisting of Ti, Cr, Mo and Al.

9. The TFT of claim 1, each of the source/drain electrodes comprises an electrode layer, the electrode layer being a first metal selected from the group consisting of Au, Ni, Pt, Pd, Os, Rh, Ru and Ir.

10. The TFT of claim 9, the adhesive layer comprises an oxide of a second metal, the second metal having a lower work function than the first metal.

11. The TFT of claim 10, the second metal being selected from the group consisting of Ti, Cr, Mo and Al.

12. A flat panel display, comprising at least one thin film transistor (TFT) arranged on a substrate, the TFT including a gate electrode, source/drain electrodes, a semiconductor layer and an insulating layer, the insulating layer being arranged between the gate electrode and the source/drain electrodes, each of the source/drain electrodes comprise an electrode layer, the electrode layer being of a first metal, the first metal being a noble metal, the semiconductor layer being of an organic semiconductor material, the insulating layer being a metal oxide and adapted to function simultaneously as a gate insulating layer for the TFT and as an adhesive layer that increases adhesion between the source/drain electrodes and the insulating layer.

13. The flat panel display of claim 12, the source/drain electrodes further comprises a binding layer arranged underneath the electrode layer, the binding layer comprising a second metal that is oxidizable, the second metal having a lower work function than the first metal, the insulating layer comprises an oxide of the second metal.

14. The flat panel display of claim 13, the first metal being selected from the group consisting of Pt, Au, Pd, Ni, Rh, Ru, Ir and Os, the second metal being selected from the group consisting of Ti, Cr, Mo and Al.

15. A method of fabricating a TFT, comprising:
   forming a gate electrode on a substrate;
   forming a gate insulating layer on the gate electrode and on exposed portions of the substrate;
   forming an adhesive layer on the gate insulating layer;

forming a source electrode and a drain electrode on the adhesive layer; and forming a semiconductor layer on the source electrode, the drain electrode and on exposed portions of the adhesive layer between the source electrode and the drain electrode.

16. The method of claim 15, the forming of the adhesive layer and the forming of the source electrode and the drain electrode comprises:

forming a first insulating layer on the gate insulating layer;

depositing a first metal layer on the first insulating layer; and etching the first metal layer and the first insulating layer to form the source electrode, the drain electrode and the adhesive layer.

17. The method of claim 16, the source electrode and the drain electrode each comprise an electrode layer, the electrode layer being a first metal and a binding layer arranged between the electrode layer and the gate insulating layer, the binding layer adapted to increase adhesion between the electrode layer and the gate insulating layer.

18. The method of claim 17, the binding layer comprises a second metal, the second metal being selected from the group consisting of Ti, Cr, Mo and Al.

19. The method of claim 17, the first insulating layer comprises an oxide of a third metal, the third metal being selected from the group consisting of Ti, Cr, Mo and Al.

20. The method of claim 16, the etching of the first insulating layer occurring simultaneously with the etching of the first metal layer, the etching using a half tone mask.

21. The method of claim 16, the etching of the first insulating layer occurring before the depositing of the first metal layer, the first metal layer etched in a second and subsequent etch step separate from the etching of the first insulating layer.

* * * * *